United States Patent [19]

Nakai et al.

[11] Patent Number: 5,055,706
[45] Date of Patent: Oct. 8, 1991

[54] DELAY CIRCUIT THAT RESETS AFTER PULSE-LIKE NOISE

[75] Inventors: Hiroto Nakai, Kawasaki; Hiroshi Iwahashi, Yokohama; Masamichi Asano, Tokyo; Shigeru Kumagai, Kawasaki, all of Japan

[73] Assignee: Kabushiki Kaisha Toshiba, Kawasaki, Japan

[21] Appl. No.: 311,798

[22] Filed: Feb. 17, 1989

Related U.S. Application Data

[63] Continuation-in-part of Ser. No. 102,647, Sep. 30, 1987, abandoned.

[30] Foreign Application Priority Data

Oct. 1, 1986 [JP] Japan ................................ 61-233446

[51] Int. Cl.$^5$ ............................................ H03K 17/28
[52] U.S. Cl. ..................................... 307/265; 307/443; 307/592; 307/597; 307/603; 307/601
[58] Field of Search ............... 307/288, 443, 548, 550, 307/265, 592, 594, 597, 603, 246, 445, 448, 601, 605

[56] References Cited

U.S. PATENT DOCUMENTS

| 3,971,960 | 7/1976 | Means et al. | 328/206 |
| 3,996,481 | 12/1976 | Chu et al. | 307/594 |
| 4,095,407 | 6/1978 | Asano et al. | 307/594 |
| 4,300,065 | 11/1981 | Remedi et al. | 307/571 |
| 4,408,168 | 1/1987 | Higuchi | 331/57 |
| 4,508,978 | 4/1985 | Reddy | 307/482 |
| 4,558,233 | 12/1985 | Nakamori | 307/362 |
| 4,570,088 | 2/1986 | Nozaki et al. | 307/481 |
| 4,583,008 | 4/1986 | Grugett | 307/443 |
| 4,634,905 | 1/1987 | Cambell, Jr. | 307/594 |
| 4,707,626 | 1/1987 | Inoue | 307/625 |
| 4,727,266 | 2/1988 | Fujii et al. | 307/443 |
| 4,786,824 | 11/1988 | Masuda | 307/290 |
| 4,797,584 | 1/1989 | Aguti et al. | 307/594 |

FOREIGN PATENT DOCUMENTS

| 0220474 | 3/1985 | German Democratic Rep. | 307/590 |
| 0114018 | 9/1980 | Japan | 307/590 |
| 0011526 | 1/1982 | Japan | 307/448 |
| 0111429 | 7/1983 | Japan | 307/601 |
| 61-104397 | 5/1986 | Japan . | |
| 0208919 | 9/1986 | Japan . | |
| 0129863 | 10/1988 | Japan | 307/594 |

Primary Examiner—Stanley D. Miller
Assistant Examiner—Terry D. Cunningham
Attorney, Agent, or Firm—Foley & Lardner

[57] ABSTRACT

A semiconductor integrated circuit including delay means for generating an output signal delayed by a predetermined time with respect to an input signal when a logic level of said input signal changes in a first direction. The delay means receives a control signal and generates an internal control signal which is delayed by a predetermined time with respect to the control signal when a logic level of the control signal changes in a first direction, including a capacitor for delaying the control signal and a resistor having one end and having the other end connected to the capacitor.

1 Claim, 14 Drawing Sheets

DELAY CIRCUIT THAT RESETS AFTER PULSE-LIKE NOISE

This is a continuation of now-abandoned application Ser. No. 07/102,647, filed Sept. 30, 1987.

BACKGROUND OF THE INVENTION

The present invention relates to a semiconductor integrated circuit, and more particularly to a semiconductor integrated circuit comprising a semiconductor memory provided with a delay circuit for delaying a chip enable signal to stably output data stored in a memory cell.

PRIOR ART

In a semiconductor integrated circuit, a delay circuit for generating an output signal delayed by a predetermined time with respect to an input signal is used in some cases. Among such delay circuits, there is known a circuit where delay is performed when an input is changed in one direction, e.g., from the 1 level to the 0 level.

FIG. 1 is a view showing an example of such a conventional delay circuit using CMOS ICs, applicable to a semiconductor integrated circuit having a semiconductor memory. This delay circuit is constituted by a CMOS inverter 101, a transfer gate 102, a charge-discharge capacitor circuit 103, a CMOS inverter 104, a transfer gate 105, a charge-discharge capacitor circuit 106, and an output circuit 107 composed of CMOS inverters at two stages. Delay is performed by the charge-discharge capacitor circuits 103, 106 and transfer gates 102, 105 when an input signal A supplied to the CMOS inverter 101 is changed from the 0 level to the 1 level.

In the delay circuit constituted as above, when the input signal A as shown in FIG. 2 is supplied to an input terminal of the CMOS inverter 101, an output signal A2 is output from the output circuit 107 after a predetermined delay time T*. In this case, the predetermined delay time T* is determined by a time constant provided by products between the capacities of the charge-discharge capacitor circuits 103, 106 and the resistances of the transfer gates 102, 105.

When the input signal A is next changed from the 1 level to the 0 level, an N channel transistor T107d receiving the signal A at the gate thereof within the output circuit 107 is turned off, and a P channel transistor T107c is turned on, so that the output signal A2 changes from the 1 level to the 0 level immediately. Accordingly, when the input signal A is changed from the 0 level to the 1 level, a delay occurs by a predetermined delay time T*, and when the input signal A is changed from the 1 level to the 0 level, the output signal A2 changes without the predetermined delay.

But as shown in FIG. 3, a pulse-like noise P1(a hazard for example) at the 1 level is often generated. And such a noise holds the input signal A at the 1 level for a short time. When the input signal A is changed from the 0 level to the 1 level corresponding to a normal signal immediately after such a noise P1, the circuitry operates as follows:

Since the input signal A is first at the 0 level, a P channel transistor T101a of the CMOS inverter 101 is turned on and the charge-discharge capacitor circuit 103 is charged through the transfer gate 102, and the potential of a node N103 of the charge-discharge capacitor circuit 103 is at the 1 level. An N channel transistor T104b of the CMOS inverter 104 is turned on by the 1 level signal of the node N103, and the charge-discharge capacitor circuit 106 is discharged through the transfer gate 105 so that the potential of a node N106 of the charge-discharge capacitor circuit 106 is at the 0 level. Accordingly, an output signal A2 at the 0 level is output from the output circuit 107 composed of inverters at two stages. In this case, a P channel transistor T107c of the output circuit 107 is turned on and a N channel transistor T107b of the output circuit 107 is turned off by the input signal A at the 0 level.

In this state, when the input signal A is changed to the 1 level by a pulse-like noise P1, an N channel transistor T101b of the CMOS inverter 101 is turned on so that the charge that has been charged in the charge-discharge capacitor circuit 103 as above begins to be discharged through the transfer gate 102 and the transistor T101b. As shown in FIG. 3, when the input signal A becomes at the 0 level succeeding to the pulse-like noise P1, the charge-discharge capacitor circuit 103 begins to be charged and to restore the charge that has been lost during the period of pulse-like noise P1. But this restoration is not accomplished because the 0 level interval between the pulse-like noise P11 and the normal input signal is too short. Then, when a normal signal is transmitted and the input signal A stably the 1 level, the charge stored at the node N103 is discharged by the transistor T101b. And the potential of the node N103 decreases as the charge stored at the node N103 discharges.

When the potential of the node N103 reaches a threshold voltage of the CMOS inverter 104, the transistor T104b is turned off and the transistor T104a is turned on.

And the capacitor circuit 106 is charged through the transistor T104a. When the potential of the node N106 reaches a threshold voltage of the CMOS inverter constituted by the transistors T107a and T107b, the transistor T107b is turned on and the transistor T107a is turned off, so that 1 level output signal A2 is output from the output circuit 107. Here, the P channel transistor T107c and the N channel transistor T107d of the output circuit 107 are turned off and on respectively by the input signal A at the 1 level.

In this case, however, as shown in FIG. 3, delay time performed is shorter than the predetermined delay time T*. The reason for this is that while the predetermined delay time T* can be gotten only when the discharging of the capacitor circuit 103 is done with the initial condition of the capacitor circuit 103 being fully charged and the potential of N103 reaches to a power source level and the capacitor circuit 106 is fully discharged and the potential of N106 reaches to a ground level, in this case discharging of the capacitor circuit 103 is done with the initial condition that the capacitor circuit 103 has been already discharged partially and the potential of N103 is somewhat below the power source level.

In a semiconductor integrated circuit which has memory function, and takes stand-by state or active state controlled by a chip enable signal, delay circuit is used. The semiconductor integrated circuit has a data output buffer circuit to output data stored in the memory cell and an output portion of the data output buffer circuit takes a high impedance state when the semiconductor integrated circuit takes the stand-by state. When the semiconductor integrated circuit changes from the stand-by state to the active state, the delay circuit delays the chip enable signal and release the output portion of the data output buffer circuit from the high impedance state after a predetermined time. It is desirable that the timing is to be set so that releasing of the output portion of the data output buffer circuit from the high impedance state may coincide with the input of data, which has been read out of a memory cell, to the data output buffer circuit. If the data output buffer circuit is released from the high impedance state before memory data is supplied to the output circuit, memory data is output after uncertain data which has opposite level to the memory data was output. In this case, large noises generate in the power sources $V_{cc}$ and $V_{ss}$ when data is output, because the current that charges and discharges large load capacities of external circuit changes its direction. And if the data output buffer circuit is released from the high impedance state after data was supplied from a memory cell, read speed falls as much.

FIG. 15 shows an IC memory of prior art which was made in this context (Japanese Patent Publication for laid open 104397/1986). The data output buffer circuit of the IC memory is controlled by the chip control signal and an output control signal ($\overline{OE}$). When the output control signal and the delayed chip control signal ($\overline{CE^{}}$) are at the logic level 'O', the output portion of the data output buffer circuit is released from the high impedance state. In the circuit of FIG. 15, delayed chip control signal $\overline{CE^{}}$ and output control signal $\overline{OE}$ are supplied to a NOR circuit consisted of transistors Tr1, Tr2, and Tr3. The output signal of the NOR circuit is converted to the signal ODL in the waveform shaping circuit which consists of four stages of inverter circuits. The signal ODL is used to control the data output buffer circuit.

But, the circuit shown in FIG. 15 still has the problem that the output timing of the signal ODL with respect to the chip control signal $\overline{CE}$ is uncertain. That is, even when the signal $\overline{CE^{**}}$ delayed by a predetermined time is generated in a delay circuit which is not shown, the output timing of the signal ODL varies as the voltage of the signal $\overline{OE}$ corresponding to the logic level 'O' varies. The logic level 'O' means $0.8_v$ in the case of TTL level, and means $O_v$ in the case of the MOS level. The voltage of the signal $\overline{OE}$ is uncertain depending on a designer's choice.

FIG. 16 shows this situation. The full line ODL1 in FIG. 16 shows a timing chart of the signal ODL when the voltage of the signal $\overline{OE}$ is OV, corresponding to the case of the MOS level, and the dotted line ODL2 shows the case when the voltage of the signal $\overline{OE}$ is 0.8V corresponding to the case of TTL level.

As shown in FIG. 16, the output timing of the signal ODL1 is earlier than that of the signal ODL2 by few nanoseconds, typically, because the on-resistance of the P channel transistor Tr2 is smaller and the charging speed for the node N160 is faster in the case when the voltage of the 'O' level signal $\overline{OE}$ is OV than in the case when the voltage of the 'O' level signal $\overline{OE}$ is 0.8V.

Therefore, the circuit of FIG. 16 still has the problem that it causes noise generation as mentioned above.

SUMMARY OF THE INVENTION

To overcome the problems mentioned above, an object of the present invention is to provide a semiconductor integrated circuit in which a predetermined delay time can be reliably obtained even when noises are included in an input signal. Another object of the present invention is to provide a semiconductor integrated circuit which outputs memory data without noise generation.

With the above objects in view, the present invention resides in a semiconductor integrated circuit comprising delay means for generating an output signal delayed by a predetermined time with respect to an input signal whose logic level changes in a first direction, having an input node for receiving said input signal, an output node for generating said output signal, capacitor means, resistor means having one end and having the other end connected to said capacitor means, a first reset means for resetting a potential of said one end of said resistor means to an initial potential (a potential of a first power source line) when the logic level of said input signal is changed in a second direction reverse to said first direction, a second reset means for resetting a potential of said other end of said resistor means to an initial potential (the potential of the first power source line) when the logic level of said input signal is changed in said second direction, and switch means for electrically connecting between said one end of said resistor means and a second power source line when the logic level of said input signal is changed in said first direction, to charge or discharge said capacitor means through said resistor means. In the semiconductor integrated circuit of the present invention mentioned above when the logic level of the input signal is changed in the predetermined direction, the output signal delayed by the predetermined time is generated. When the input signal is changed in the direction reverse to the predetermined direction, the potentials of all nodes in the delay means are reset to their respective initial values.

The present invention also resides in a semiconductor integrated circuit that takes a standby state or an active state controlled by a control signal, said semiconductor integrated circuit comprising a data output buffer circuit controlled by the control signal, delay means for delaying the control signal by a predetermined delay time when the control signal is changed in a predetermined direction, to control an output portion of the data output buffer circuit to be released from a high impedance state a predetermined time after the control signal changes in the predetermined direction, and reset means for resetting the potentials of all nodes in the delay means to their respective initial values when the control signal is changed in the direction reverse to the predetermined direction. In the semiconductor integrated circuit of the present invention, when the control signal is changed in the direction reverse to the predetermined direction, the output portion of the data output buffer circuit is controlled to the high impedance state rapidly.

BRIEF DESCRIPTION OF THE DRAWINGS

The present invention will be more apparent from the following description of the preferred embodiments thereof in conjunction with the drawings in which.

DETAILED DESCRIPTION OF THE PREFERRED EMBODIMENTS

The preferred embodiments of the present invention will be now described with reference to the drawings.

Figure 4:
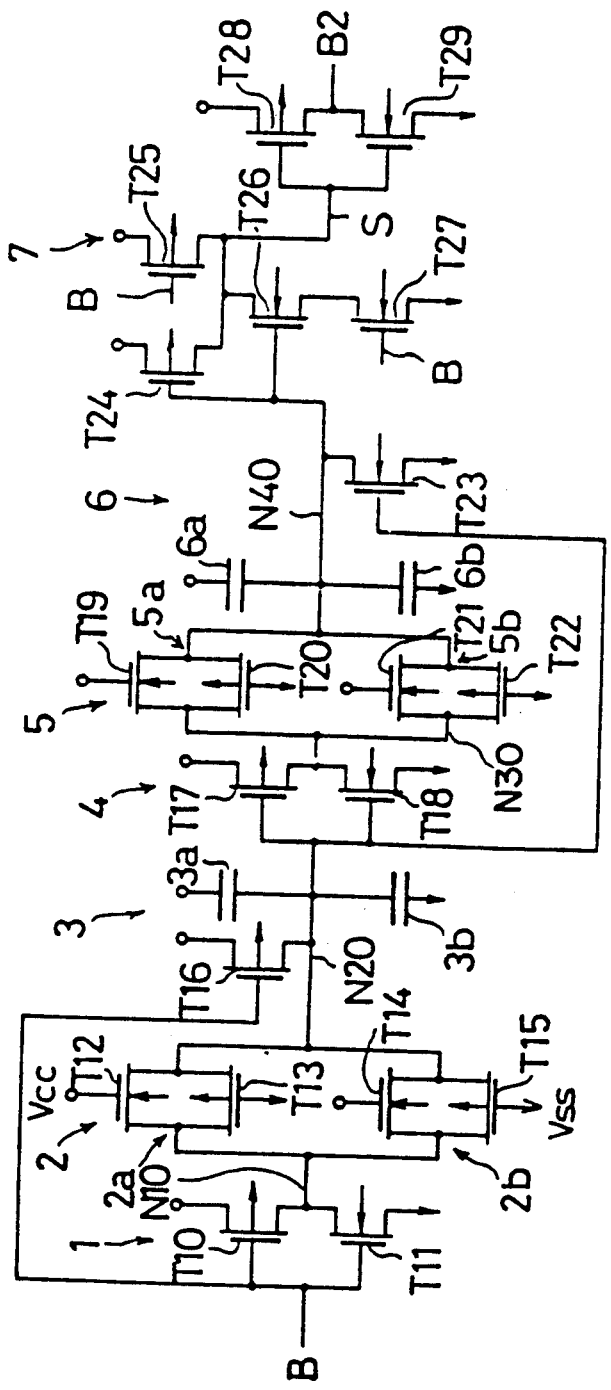
FIG. 4 is a view showing a delay circuit applicable to a semiconductor integrated circuit in accordance with one embodiment of the present invention.

FIG. 4 shows a delay circuit applied to a semiconductor integrated circuit in accordance with one embodiment of the present invention. In FIG. 4, the delay circuit is constituted by a CMOS inverter 1 receiving an input signal B, a transfer gate circuit 2, a charge-discharge capacitor circuit 3, a CMOS inverter 4, a transfer gate circuit 5, a charge-discharge capacitor circuit 6, and an output circuit 7. An output signal B2 provided by delaying the input signal B as explained below is output from the output circuit 7.

The CMOS inverter 1 includes a first reset transistor T10 which is constituted by a P channel transistor, and a first switching transistor T11 which is constituted by an N channel transistor, and the input signal B is supplied to the gates of these transistors. The gates of the transistors T10 and T11 form the input node of the inverter 1 and the delay circuit. An output node of the CMOS inverter 1, (i.e., a node N10) is connected to one terminal of the transfer gate circuit 2, and the other terminal of the transfer gate circuit 2 is connected to a node N20 of the charge-discharge capacitor circuit 3. The transfer gate circuit 2 comprises a first transfer gate 2a composed of N and P channel transistors T12 and T13, and a second transfer gate 2b composed of N and P channel transistors T14 and T15 connected in parallel to the first transfer gate 2a.

The charge-discharge capacitor circuit 3 comprises capacitors 3a and 3b connected between the node N20 and power source lines, and a second reset transistor T16 which is constituted by a P channel transistor connected at the drain thereof to the node N20. The node N20 is connected to an input terminal of the CMOS inverter 4. The second reset transistor T16 is similar in function to the first reset transistor T10 of the CMOS inverter 1, and the gate of the second reset transistor T16 receives the input signal B, similar to the first reset transistor T10.

The CMOS inverter 4 includes a second switching transistor T17 which is constituted by a P channel transistor, a third reset transistor T18 which is constituted by an N channel transistor and an output terminal of the CMOS inverter 4 (i.e., a node N30) which is connected to the charge-discharge capacitor circuit 6 at a node N40 through the transfer gate circuit 5. The transfer gate circuit 5, similar to the transfer gate circuit 2, comprises a third transfer gate 5a composed of N and P channel transistors T19 and T20, and a fourth transfer gate 5b composed of N and P channel transistors T21 and T22 connected in parallel to the third transfer gate 5a. The charge-discharge capacitor circuit 6, similar to the charge-discharge capacitor circuit 3, comprises capacitors 6a and 6b connected between the node N40 and power source lines, and a fourth reset transistor T23 constituted by an N channel transistor connected at the drain thereof to the node N40. The fourth reset transistor T23 is similar in function to the third reset transistor T18 of the CMOS inverter 4, and the gate of the fourth reset transistor T23 is connected to the node N20 of the charge-discharge capacitor circuit 3. Further, the node N40 of the charge-discharge capacitor circuit 6 is connected to an input terminal of the output circuit 7.

The output circuit 7 comprises a NAND gate logic circuit constituted by P channel transistors (T24 and T25) and N channel transistors (T26 and T27). The NAND gate logic circuit has a first input terminal connected to the node N40, a second input terminal receiving the input signal B and an output terminal (a node S). The output circuit 7, further comprises a CMOS inverter constituted by a P channel transistor T28 and an N channel transistor T29. The CMOS inverter has a input terminal connected to the node S, and generates output signal B2 of the delay circuit.

The transfer gate circuits 2 and 5 constitute resistors for discharging and charging the charge-discharge capacitor circuits 3 and 6, respectively. Here, two transfer gates are connected in parallel in each transfer gate circuit only for controlling the resistance value. It is possible to construct the transfer gate circuit 2 or 5 with one transfer gate when a suitable resistance value is obtained. When the transfer gate circuit is constructed from the two transfer gates connected in parallel to each other, one of the transfer gates can be separated from the other by laser beam, for example, when it is necessary to increase the delay time after the semiconductor integrated circuit has been manufactured.

In the semiconductor integrated circuit constructed as above, when the input signal B is at the 0 level, the first reset transistor T10 and the second reset transistor T16 are turned on, and the first switching transistor T11 is turned off, so that the node N10 and the charge-discharge capacitor circuit 3 are charged by a power source $V_{cc}$ supplied to the source of the first reset transistor T10 and the second reset transistor T16, and therefore the potential of the node N20 of the charge-discharge capacitor circuit 3 is at the level of the power source $V_{cc}$ The third reset transistor T18 and the fourth reset transistor T23 are turned on and the second switching transistor T17 is turned off by the signal of the node N20 at the 1 level so that the charge-discharge capacitor circuit 6 is discharged, and the potential of the node N40 of the charge-discharge capacitor circuit 6 becomes at the level of a power source $V_{ss}$. Further, the transistors T24 and T26 of the output circuit 7 are turned on and off, respectively by the signal of the node N40 at the 0 level and the transistors T25 and T27 of the output circuit are turned on and off, respectively by the input signal B at the 0 level, so that the transistor T28 and T29 of the CMOS inverter at the final stage is turned off and turned on, respectively, and the output signal B2 takes the 0 level.

Figure 1:
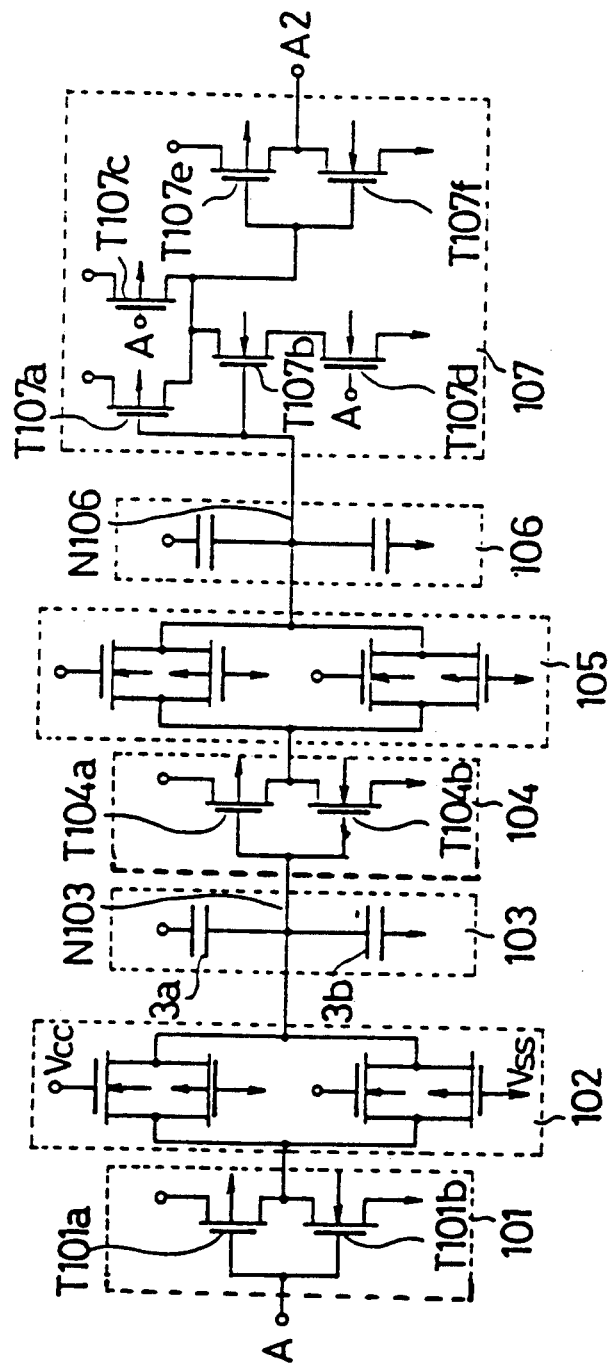
FIG. 1 is a view showing a conventional delay circuit.
Figure 2:
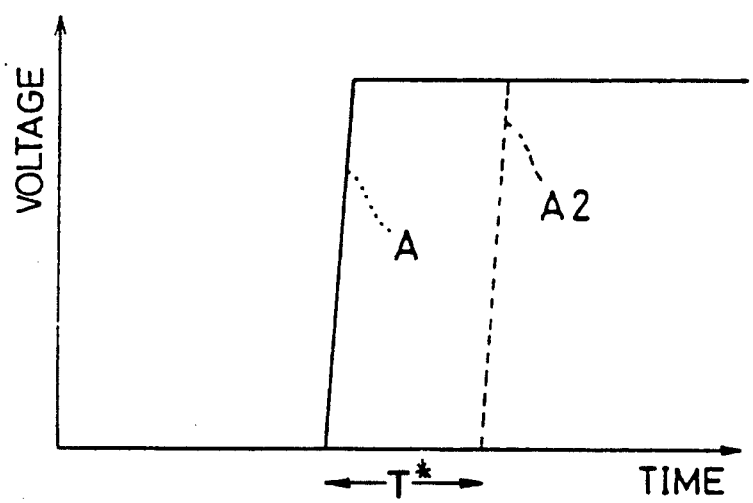
FIGS. 2 and 3 are views showing waveforms of signals in the delay circuit of FIG. 1 to explain the operation thereof.
Figure 3:
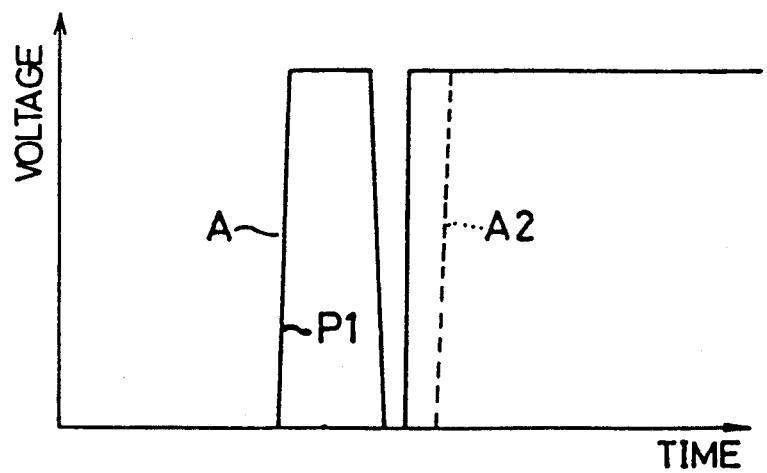
Figure 5:
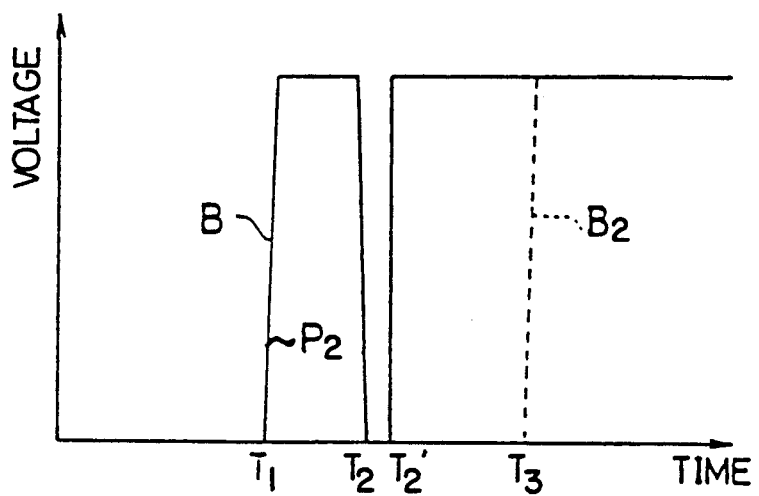
FIG. 5 is a view showing waveforms of signals in the delay circuit of FIG. 4 to explain the operation thereof.

Then, when the input signal B is changed from the 0 level to the 1 level by the generation of a pulse-like noise P2 as shown in FIG. 5 similar to FIG. 3, the first reset transistor T10 and the second reset transistor T16 are turned off and the first switching transistor T11 is turned on so that the potential of the Node N20 decreases, i.e., the charge in the charge-discharge capacitor circuit is discharged through the transfer gate circuit 2 and the first switching transistor T11. However, in this case, since the input signal B is at the 1 level for a relatively short time, like a time period $T_1$ to $T_2$ shown in FIG. 5, the level of the node N20 of the charge-discharge capacitor circuit 3 does not completely reach the level of the power source $V_{ss}$. It becomes at 2.5 volts, for example. Accordingly, the second switching transistor T17 is somewhat turned on, but is not completely turned on, and the third reset transistor T18 and the fourth reset transistor T23 are somewhat turned off in this intermediate level of the node N20, but are not completely turned off, so that the potential of the node N30 of the output of the inverter 4 and the node N40 of the charge-discharge capacitor circuit 6 are increased to only about 2.5 volt and 1 volt, respectively, for example, although this value depends on the sizes of the transistors. At this time, since the input signal B is at the 1 level, the transistor T25 is turned off and the transistor T27 is turned on. On the other hand, at this time, since the potential of the node N40 of the charge-discharge capacitor circuit 6 is low, e.g. about 1 volt as described above, the transistor T24 is sufficiently turned on and the transistor T26 is a little or partially turned on, so that the level of the node S remains at the 1 level. Accordingly, the output B2 of the output circuit 7 remains at the 0 level.

In such a state, when the input signal B becomes at the 0 level at time $T_2$ as shown in FIG. 5, the first reset transistor T10 and the second reset transistor T16 are turned on, so that the node N10 and the charge-discharge capacitor circuit 3 are rapidly charged through the transistors T10 and T16 and the potential of the node N20 is increased to the level of the power source $V_{cc}$ Accordingly, the third reset transistor T18 and the fourth reset transistor T23 are turned on by the 1 level of the node N20, so that the node N30 and the charge-discharge capacitor circuit 6 are rapidly discharged through the transistor T18 and T23, and the potential of the node N40 is lowered to the level of the power source $V_{ss}$. Accordingly, the node S remains at the 1 level, and the output B2 of the output circuit 7 remains at the 0 level. Namely, even when a pulse-like noise P2 at the 1 level generates in the input signal B shortly before a normal signal at the 1 level, the charge-discharge capacitor circuit 3 is charged completely to the potential of the power source $V_{cc}$ and the charge-discharge circuit 6 is discharged completely to the potential of the power source $V_{ss}$ by the actions of the reset transistors T10, T16, T18 and T23 during the time interval, where the input signal B is at the 0 level, between the pulse-like noise P2 and the input of a normal signal at the 1 level, and the delay circuit of FIG. 4 is reset to the same initial condition as before the generation of the pulse-like noise P2, $T < T_1$ in the case shown in FIG. 5. By combining the reset action of the reset transistors T10 and T18 to that of the reset transistors T16 and T23, the more rapidly the internal state of the delay circuit of FIG. 4 is reset to the initial condition.

When the input signal B stably becomes at the 1 level corresponding to the normal signal at time $T_2'$ after the noise P2 has been disappeared, the first switching transistor T11 of the CMOS inverter 1 is turned on, and the charge-discharge capacitor circuit 3 is discharged through the transfer gate circuit 2 and the first switching transistor T11, so that the level of the node N20 decreases to the 0 level. The second switching transistor T17 of the CMOS inverter 4 is then turned on by the 0 level signal of the node N20, and the charge-discharge capacitor circuit 6 is charged through the transfer gate circuit 5 and the second switching transistor T17, so that the level of the node N40 of the charge-discharge capacitor circuit 6 is increased to the 1 level. As a result, transistors T24 and T26 of the output circuit 7 are turned off and turned on, respectively, and the voltage of the node S takes the 0 level, and the output B2 of the output circuit 7 takes the 1 level. In this case, the input signal B is delayed by a time period $T_2'$ to $T_3$ of FIG. 5, so that the delayed input signal is output from the output circuit 7. The interval of this time period is determined only by a time constant of the charge-discharge capacitor circuit 3 and the transfer gate circuit 2, and a time constant of the charge-discharge capacitor circuit 6 and the transfer gate circuit 5, and is independent of the generation of the pulse-like noise P2.

That is, the interval of the time period $T_2'$ to $T_3$ is equal to the predetermined delay time T*, because the charged-discharged states of the charge-discharge capacitor circuits 3 and 6 are returned to the initial states thereof by the actions of the rest transistors T10, T16, T18 and T23 during T2 to T3, as described before.

The gate capacities of the inverter 4 and the inverter of the output circuit 7 may be respectively substituted for the charge-discharge capacitor circuits 3 and 6, although it depends on the set value of the delay time.

Figure 6:
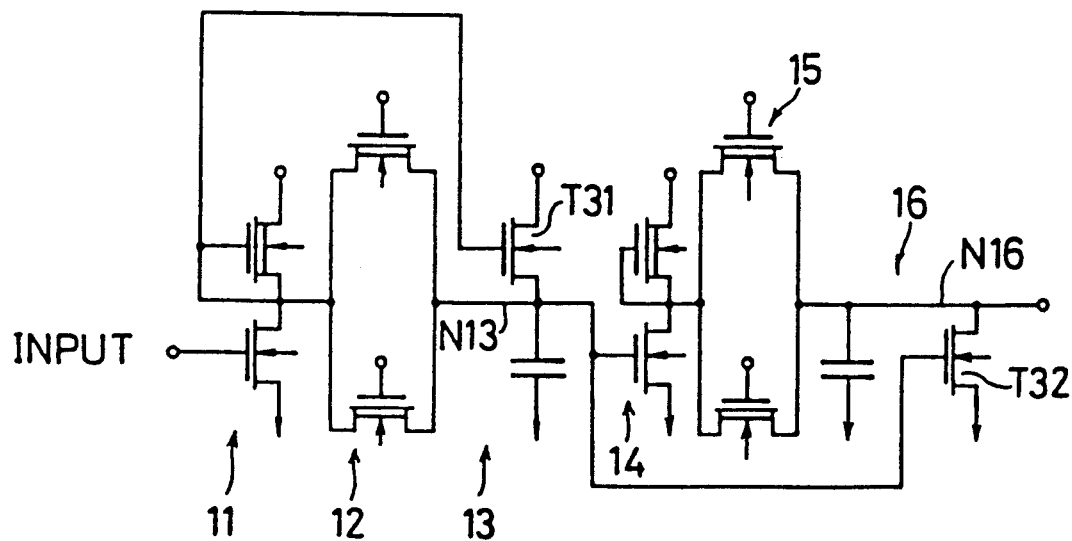
FIG. 6 is a view showing a delay circuit applicable to a semiconductor integrated circuit in accordance with another embodiment of the present invention.

FIG. 6 illustrates a circuit showing another embodiment of the present invention, in which a delay circuit (an output circuit is not shown) is formed by N channel MOS transistors. The circuitry of FIG. 6 comprises, similar to the embodiment of FIG. 4, an inverter 11, a transfer gate circuit 12, a charge-discharge capacitor circuit 13, an inverter 14, a transfer gate circuit 15, and a chargedischarge capacitor circuit 16. The charge-discharge capacitor circuits 13 and 16 are respectively connected to a transistor T31 for rapid charge and a transistor T32 for rapid discharge so that the circuitry of FIG. 6 is operated similar to the circuitry of FIG. 4.

An N channel MOS transistor substantially with a OV threshold voltage can be appropriately used for the transistor T31, so that the delay circuit may be reset more rapidly. The cost of production of the delay circuit is made lower by forming the delay circuit by N channel MOS transistors only.

Figure 7:
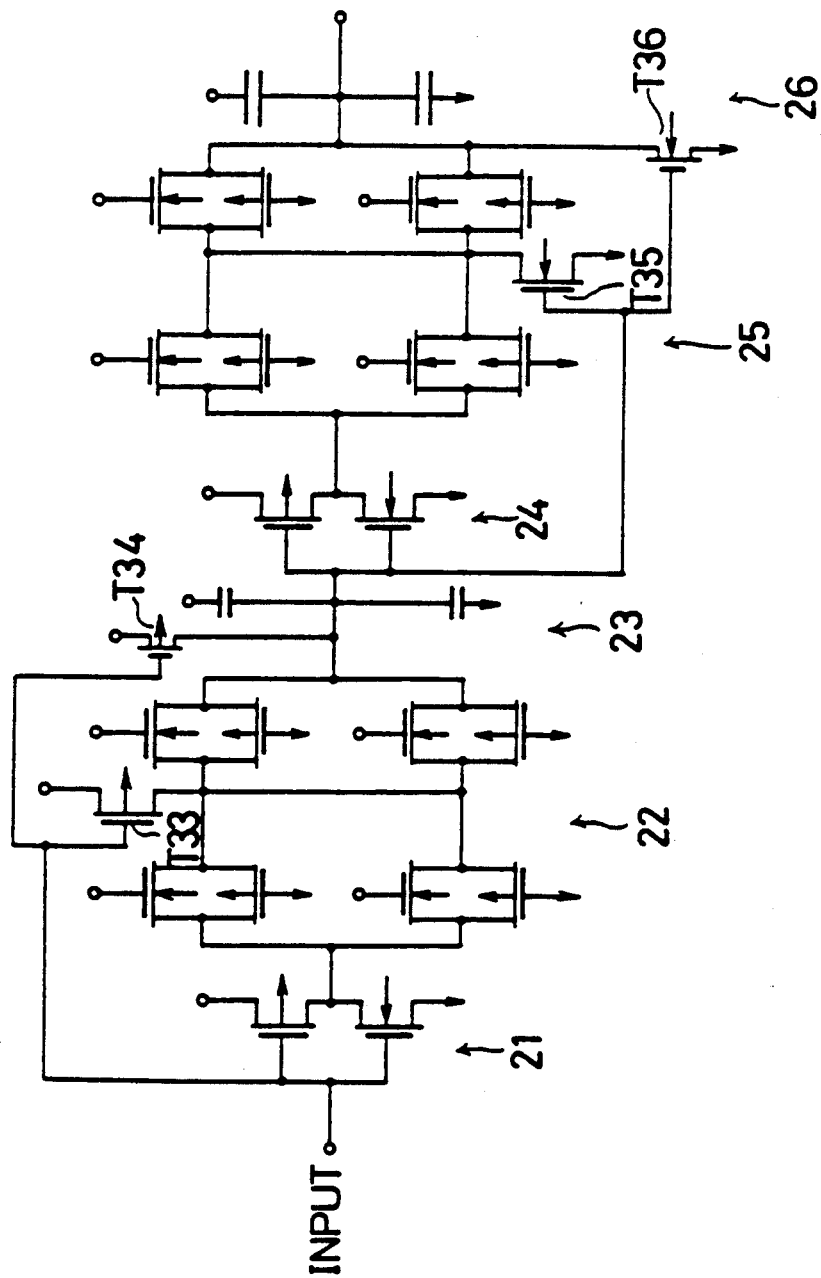
FIG. 7 is a view showing a delay circuit applicable to a semiconductor integrated circuit in accordance with a further embodiment of the present invention.

FIG. 7 illustrates circuitry showing further another embodiment of the present invention. The circuit of FIG. 7 is a delay circuit (an output circuit is not shown) for a CMOS IC, and is constructed so that charge and discharge may be rapid. Namely, the circuitry of FIG. 7 comprises, basically similar to FIG. 4, an inverter 21, a transfer gate circuit 22, a chargedischarge capacitor circuit 23, an inverter 24, a transfer gate circuit 25 and a charge-discharge capacitor circuit 26. In this embodiment, the transfer gate circuit 22 consists of two stages of transfer gates. And each stage of transfer gates consists of two transfer gates connected to each other in parallel. The charge-discharge capacitor circuit 23 is connected to the drain of a P channel reset transistor T34, and the connection node between the two stages of transfer gates is connected to the drain of a P channel reset transistor T33.

Furthermore, the transfer gate circuit 25 consists of two stages of transfer gates. And each stage of transfer gates consists of two transfer gates connected each other in parallel. The charge-discharge capacitor circuit 26 is connected to the drain of an N channel reset transistor T36 and the connection node between the two stages of transfer gates is connected to the drain of an N channel reset transistor T35.

FIGS. 8 to 12 illustrate circuits of a semiconductor integrated circuit including a memory circuit for reading out data from memory cell in accordance with another embodiment of the present invention, in which a chip control signal is delayed by a delay circuit having the same construction as the delay circuit of FIG. 4 so as to stably output data from the memory circuit. In particular, in this case, in order to prevent errors in operation from occuring when the chip control signal $\overline{CE}$ is changed from 1 level to 0 level and the memory circuit is changed from a standby state to an active state, an internal control signal CE*1 in the negative phase to the chip control signal $\overline{CE}$ is delayed by the delay circuit to form a delayed output signal CE** which is used to control the state of a data output buffer circuit of FIG. 12.

Figure 8:
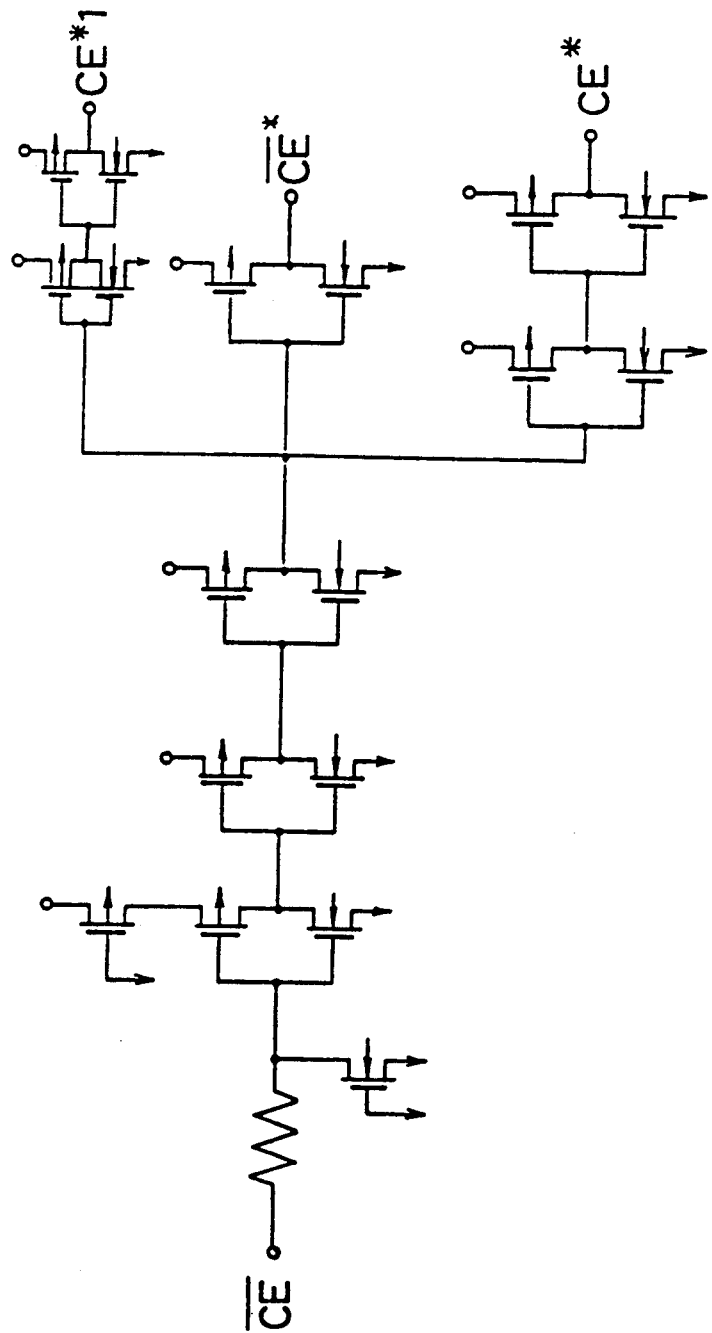
FIGS. 8 to 12 are views showing a semiconductor integrated circuit in accordance with a further embodiment of the present invention.
Figure 9:
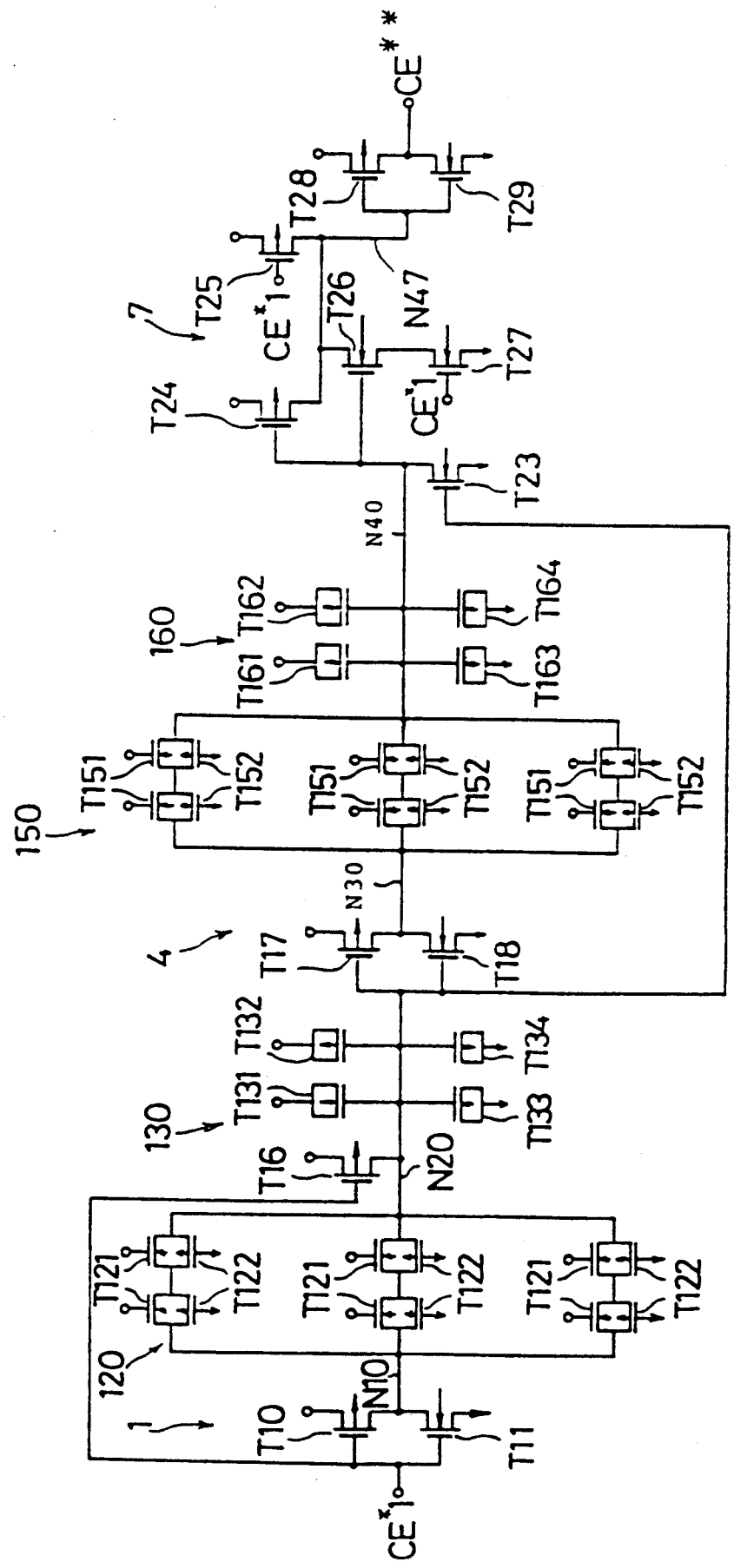

In a CE buffer circuit shown in FIG. 8, an internal control signal $\overline{CE}$* in the in-phase to the chip control signal $\overline{CE}$ and internal control signals CE* and CE*1 in the negative phase to the chip control signal $\overline{CE}$ are formed from the chip control signal $\overline{CE}$, and the internal control signal CE*1 is delayed by the delay circuit shown in FIG. 9.

In the delay circuit of FIG. 9, the number of transfer gates connected in series and parallel to each other is larger than that of the transfer gates in the transfer gate circuits 2 and 5 of the delay circuit of FIG. 4, and MOS transsistors are disposed instead of the respective capacitors in the charge-discharge capacitor circuits 3 and 6 in the delay circuit of FIG. 4. The other construction of the delay circuit of FIG. 9 is basically similar to that of FIG. 4, and, therefore, other constructional elements are designated by the same reference numerals as those of FIG. 4. Accordingly, the operation of the delay circuit of FIG. 9 will be described next only with respect to the differences in operation from the delay circuit of FIG. 4.

A transfer gate circuit 120 corresponds to the transfer gate circuit 2 of FIG. 4. Each of two transfer gates connected in series to each other comprises an N channel transistor T121 connected at the gate thereof to the power source $V_{cc}$, and a P channel transistor T122 connected in parallel to the N channel transistor T121 and connected at the gate thereof to the power source $V_{ss}$. Such two transfer gates constitute each of three circuits connected in parallel to each other. A transfer gate circuit 150 also corresponds to the transfer gate circuit 5 of FIG. 4. Each of two transfer gates connected in series to each other comprises an N channel transistor T151 connected at the gate thereof to the power source $V_{cc}$, and a P channel transistor T152 and connected at the gate thereof to the power source $V_{ss}$. Such two transfer gates constitute each of three circuits connected in parallel to each other. Further, charge-discharge capacitor circuits 130 and 160 correspond to the charge-discharge capacitor circuits 3 and 6 of FIG. 4, respectively. MOS transistors T131, T132, T133, T134, T161, T162, T163 and T164 are disposed instead of the capacitors 3a, 3b, 6a and 6b of FIG. 4.

Figure 10:
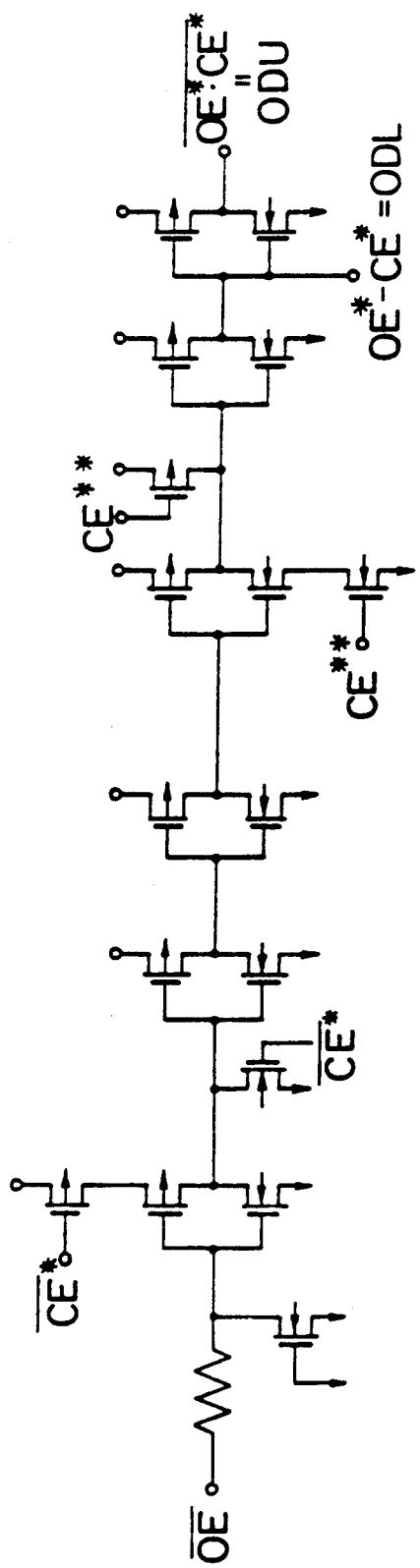
Figure 11:
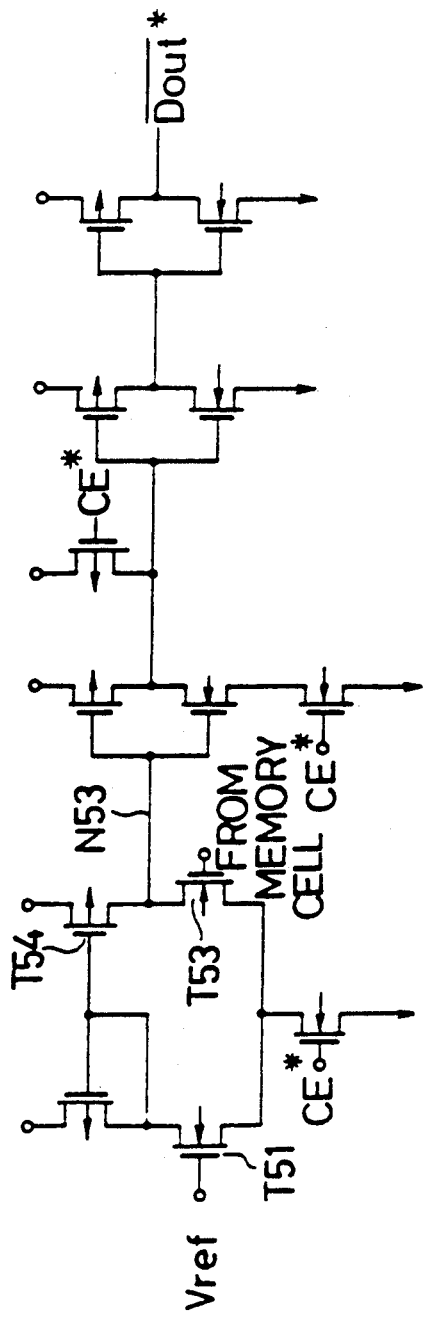
Figure 12:
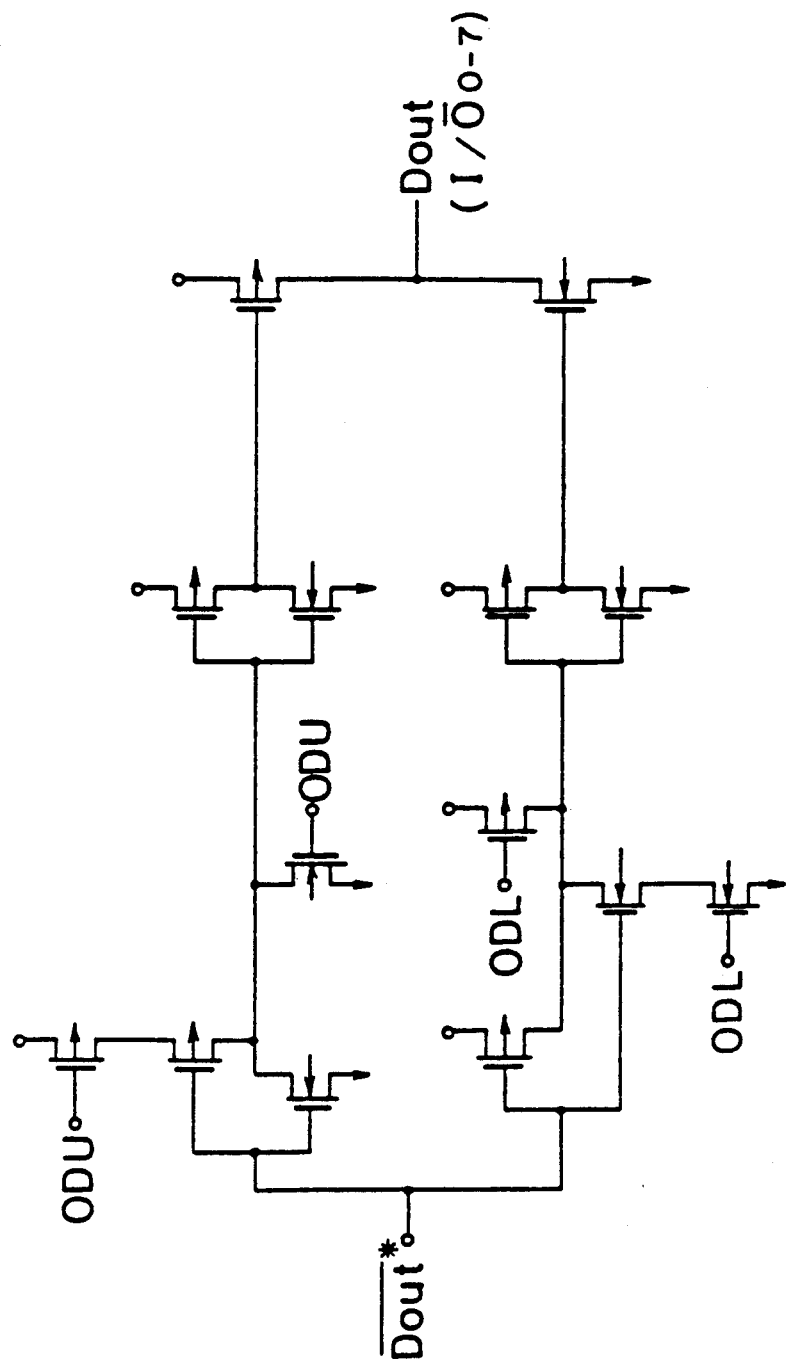

In the delay circuit of FIG. 9, constituted as above, the internal control signal CE*1 is delayed, and is supplied as the delayed output signal CE to an $\overline{OE}$ buffer circuit shown in FIG. 10. ODL and ODU signals are output from the $\overline{OE}$ buffer circuit of FIG. 10 and supplied to the data output buffer circuit shown in FIG. 12. The $\overline{OE}$ buffer circuit outputs the signals ODL and ODU, which release the data output buffer circuit of FIG. 12 from the high impedance state, only when the '0' level signal of an output control signal $\overline{OE}$ and the '1' level signal of the delayed output signal CE are input. A memory output signal $\overline{Dout}$* detected by a current mirror circuit in a sense amplifier shown in FIG. 11 is supplied to the data output buffer circuit of FIG. 12. The internal control signal $\overline{CE}$* is supplied to the $\overline{OE}$ buffer circuit of FIG. 10, and the internal control signal CE* is supplied to the sense amplifier of FIG. 11.

The chip control signal $\overline{CE}$ is a signal for controlling the memory circuit to take the standby state or the active state. After the chip control signal $\overline{CE}$ is changed from the 1 level to the 0 level and the memory circuit has been changed from the standby state to the active state, inaccurate data is output from the sense amplifier until a memory cell is selected by a predetermined address. Namely, before a reference potential $V_{ref}$ stably becomes a predetermined potential and the potential from the memory cell stably becomes a potential corresponding to a data of the memory cell, an output of the sense amplifier circuit ($\overline{Dout}$*) FIG. 12 reach an uncertain level. In the case where proper data read out of a memory cell has an opposite level to such uncertain level, electric current, which charges a load capacity, changes its flow direction in a very short time, and a large noise generates in $V_{cc}$ and $V_{ss}$ lines and the levels of $V_{cc}$ and $V_{ss}$ greatly vary. In this case it is liable to generate errors in operation of the semiconductor integrated circuit and another semiconductor integrated circuit commonly connected to the output node of the output buffer circuit of FIG. 12.

To solve the problems mentioned above, in the present invention, when the chip control signal $\overline{CE}$ is changed from the 1 level to the 0 level, the internal control signal CE*1 which changes from the 0 level to the 1 level is formed in the CE buffer circuit of FIG. 8, and the delayed output signal CE** which changes from the 0 level to the 1 level predetermined delay time after the chip control signal $\overline{CE}$ was changed is formed by delaying the internal control signal CE*1 in the delay circuit of FIG. 9, and the signals ODL and ODU are respectively kept at the 0 level and the 1 level by the signal CE** at the 0 level and the output buffer circuit stays in the high impedance state until the data of the memory cell is output from the sense amplifier as the memory output signal $\overline{Dout}$*, so that uncertain data which do not correspond to the data of the memory cell are not output as the output (Dout) of the data output buffer circuit.

In general, there are the $\overline{CE}$ (chip control) signals and the $\overline{OE}$ (output control) signals as control signals for the semiconductor memory. The former signal is used to make the semiconductor memory reach the standby state or the active state, and the latter signal is used to put the output portion of the data output buffer circuit of the semiconductor memory in a high impedance state or an output state. An output signal of the CE buffer circuit is an input signal of the OE buffer circuit, and the output portion of the data output buffer circuit becomes in the high impedance state when the $\overline{CE}$ signal is at the 1 level and therefore the semiconductor memory is in the standby state.

As mentioned above, the output portion of the data output buffer circuit is preferably in the high impedance state until data from the memory cell selected by a predetermined address is output from the sense amplifier circuit. On the other hand, when the semiconductor memory is changed from the active state to the standby state, corresponding to the change of the signal $\overline{CE}$ from the 0 level to the 1 level, the output portion preferably takes the high impedance state rapidly, because in many systems comprising semiconductor memories, output portions of a plurality of memory ICs are commonly connected to an output bus line. And it is necessary that means for switching is disposed in the output portions of each memory IC to prevent mal-interferences between different memories. Namely, when data is output from an IC, the other ICs are to be set in the high impedance state by turning off the switching means. If the other ICs are not set in the high impedance state, electric currents will flow in and out between transistors in the output portions of the plurality of ICs so that correct data cannot be output therefrom. Therefore, the output portions of the ICs connected to the bus line preferably be set in the high impedance state rapidly as another IC is accessed. As the time from the inputting of a control signal to the setting of the high impedance state is shorter, the time for outputting data from the IC to the bus line can be made shorter, and the processing speed of the system is improved.

As mentioned above, as the time during which semiconductor memories are changed from the active state to the standby state is shorter, the other semiconductor memories can be changed to the active state for a shorter time. Accordingly, in the present embodiments circuits are constructed so that, when the signal $\overline{CE}$ is changed from the 1 level to the 0 level, a predetermined delay is performed and the delayed output signal (CE) controls the OE buffer circuit, the output portion of the semiconductor memory is kept in the standby state until the signal CE is changed to the 1 level. Further, when the signal $\overline{CE}$ is changed from the 0 level to the 1 level, the predetermined delay is not performed with respect to the signal CE** and the output portion of the semiconductor memory becomes in the high impedance state rapidly. When the $\overline{CE}$ signal is changed from the 0 level to the 1 level and the internal control signal CE*1 of the $\overline{CE}$ buffer circuit of FIG. 8 is changed from the 1 level to the 0 level, the N channel transistor T27 in the delay circuit of FIG. 9 is turned off and the P channel transistor T25 in the delay circuit of FIG. 9 is turned on, so that the node N47 is charged by the P channel transistor T25 irrespective of the potential of the node N40 of the delay circuit, and the CE** signal is changed from the 1 level to the 0 level without delay by the transfer gate circuit and the charge-discharge circuit.

Generally, in semiconductor memory the internal control signal CE* is supplied to the gates of many MOS transistors of the internal circuit, for example address buffer circuits, predecoder, etc., as well as to the sense amplifier circuit of FIG. 11. The capacities of these gate circuits are several pF, for example, which is considerably large. Accordingly, the delay time from the change of the chip control signal $\overline{CE}$ to the change of the internal control signal CE* is long. In contrast, the internal control CE*1 is only supplied to the MOS transistors T10, T11, T25 and T27 of the delay circuit of FIG. 9, whose capacities are small, 0.1 pF for example, and the delay time is very short. Therefore, when the chip control signal $\overline{CE}$ is changed from the 0 level to the 1 level, the internal control signal CE*1 is much more rapidly changed from the 1 level to the 0 level compared to the change of the internal control signal CE*, thereby rapidly makes the output buffer circuit in the high impedance state through the $\overline{OE}$ buffer circuit. Thus, even when the internal circuit delays in assuming the standby state due to the delay of the internal control signal CE*, the output buffer circuit of the memory IC rapidly assumes the high impedance state by the signal CE*1.

In the $\overline{OE}$ buffer circuit of FIG. 10, the signal $\overline{OE}$ is supplied to the NAND gate to which the signal CE** is supplied, through the NOR gate to which the signal $\overline{CE}$* is supplied and two stages of inverters. By this construction, the correct delay time is obtained independent of the choice of voltage for representing the 0 logic level of the signal $\overline{OE}$.

Figure 13:
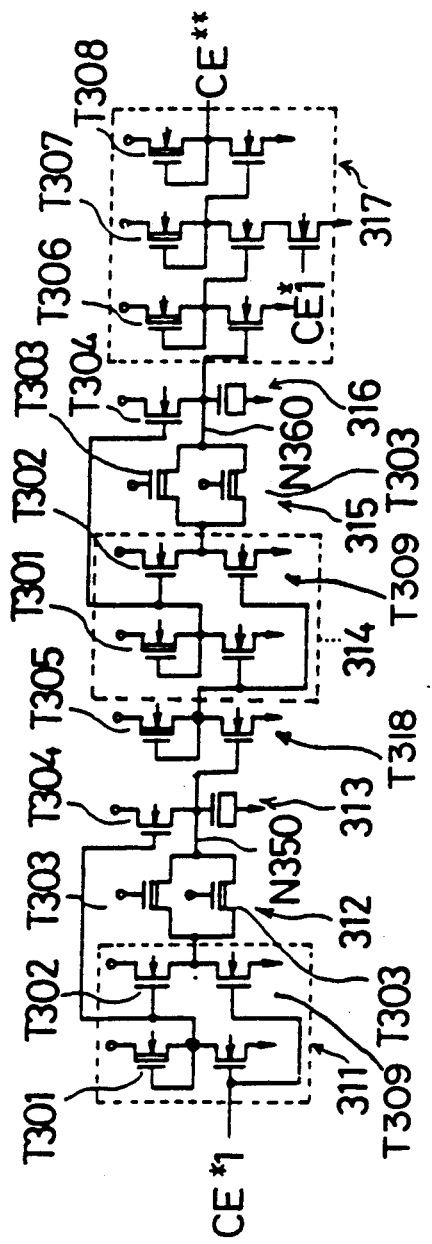
FIG. 13 is a view showing a delay circuit applicable to a semiconductor integrated circuit in accordance with a further embodiment of the present invention.

FIG. 13 shows a delay circuit of a semiconductor integrated circuit in accordance with another embodiment of the present invention in which the delay circuit is constituted by N channel MOS transistors only.

The delay circuit comprises an inverter circuit 311, a transfer gate circuit 312, a charge-discharge capacitor circuit 313, an inverter 318, an inverter circuit 314, a transfer gate circuit 315, a charge-discharge capacitor circuit 316 and an output circuit 317. Two transistors T304 are connected to the charge-discharge capacitor circuits 313 and 316, to reset the potentials of the nodes N350 and N360 respectively. In FIG. 13, all of transistors are N channel MOS transistors.

The delay circuit comprises a delay portion of two stages. The first delay portion is composed of inverter circuit 311, transfer gate circuit 312, and charge-discharge capacitor circuit 313. The second delay portion is composed of inverter circuit 314, transfer gate circuit 315, and charge-discharge capacitor circuit 316. Output signals of the first delay portion are supplied to the second delay portion through the inverter 318. Output signals of the second delay portion are supplied to the output circuit 317. The first delay portion comprises E-D type converter, first reset transistor T302, switching transistor T309 and second reset transistor T304. The operations of the first reset transistor T302, switching transistor T309, and the second reset transistor T304 correspond to those of P-channel transistor T10, N-channel transistor T11, and P-channel transistor T16 of FIG. 9, respectively.

The second delay portion has the same construction as the first delay portion. Transistors which do the same operation have a common reference numeral in the both delay portions. By constructing two stages of delay portions as shown in FIG. 13, adjustments of delay time can be done easily.

The transfer gate circuit is constructed from two depletion type N-channel transistors T303 connected in parallel.

By using N-channel transistors with threshold voltages in the vicinity of $0_v$ to the first reset transistor T302 and the second reset transistor T304, very rapid reset action is obtained. The operations of transfer gate 312 and charge-discharge capacitor circuit 313 are similar to those of the transfer gate circuit 120, the charge-discharge capacitor circuit 130 in FIG. 9.

In the delay circuit of FIG. 9 mentioned above, when the chip control signal $\overline{CE}$ is changed from the 1 level to the 0 level, the delayed output signal CE** of the delay circuit is delayed by a predetermined time, and at this time, the potential of the node N20 of the charge-discharge capacitor circuit 130 is changed from the 1 level to the 0 level, and the potential of the node N40 of the charge-discharge capacitor circuit 160 is changed from the 0 level to the 1 level. However, in the delay circuit of FIG. 13, when the chip control signal $\overline{CE}$ is changed from the 1 level to the 0 level, the potential of the node N350 of the charge-discharge capacitor circuit 313 is changed from the 1 level to the 0 level, and the potential of the node N360 of the charge-discharge capacitor circuit 316 is similarly changed from the 1 level to the 0 level. Since a threshold value of the inverter circuit constituted by the N channel MOS transistors is low (generally below 1 volt), the delay time when an input signal of the inverter is changed from the 0 level to the 1 level and the output thereof is switched from the 1 level to the 0 level, is greatly shorter than the delay time when the input signal of the inverter is changed from the 1 level to the 0 level and the output thereof is switched. Therefore, the inverter circuit 314 inputs a signal which is in phase with the input signal CE*1, and more reliable performance is realized than by the delay circuit of FIG. 6.

Further, the output circuit 317 is constituted by N channel transistors so that the delay may not be performed by the resistances of the transfer gate circuits and the capacities of the charge-discharge capacitor circuits, when the chip control signal $\overline{CE}$ is changed from the 0 level to the 1 level.

Figure 14:
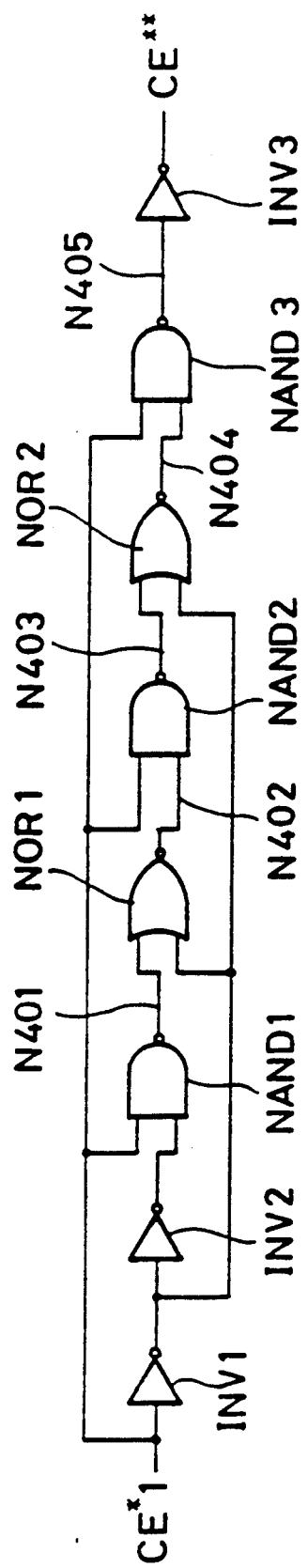
FIG. 14 is a view showing a delay circuit applicable to a semiconductor integrated circuit in accordance with a further embodiment of the present invention.
Figure 15:
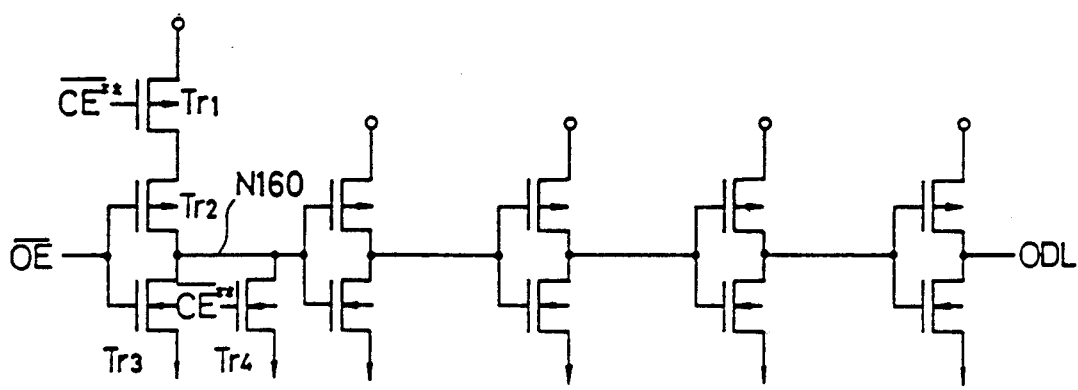
FIG. 15 is a view showing a part of buffer control circuit of prior art for generating an output buffer control signal.
Figure 16:
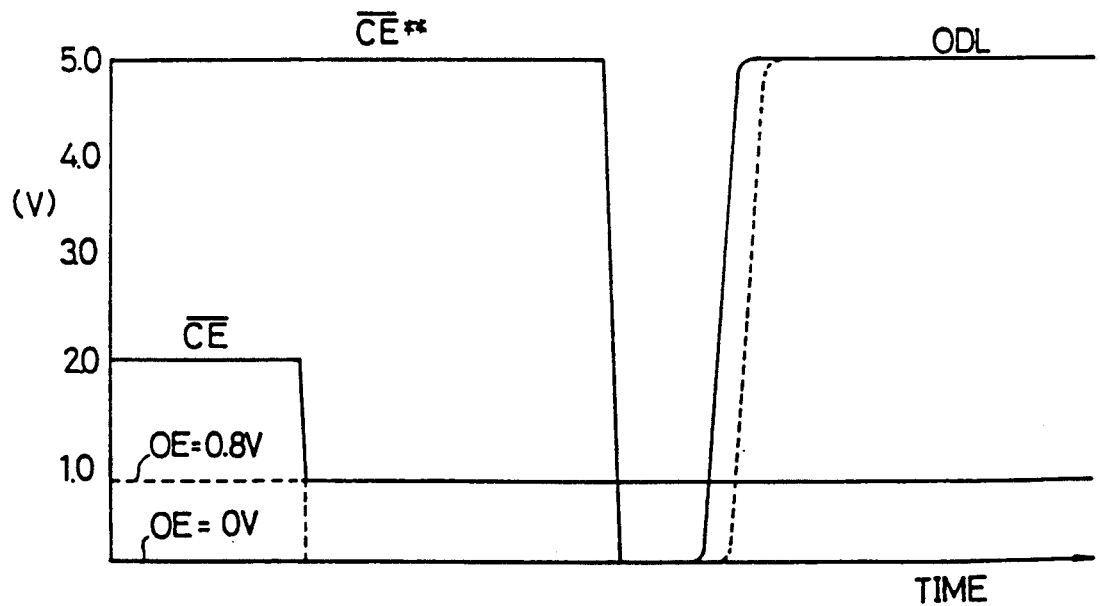
FIG. 16 is a view showing timing charts of the signals in the buffer control circuit of FIG. 15.
Figure 17:
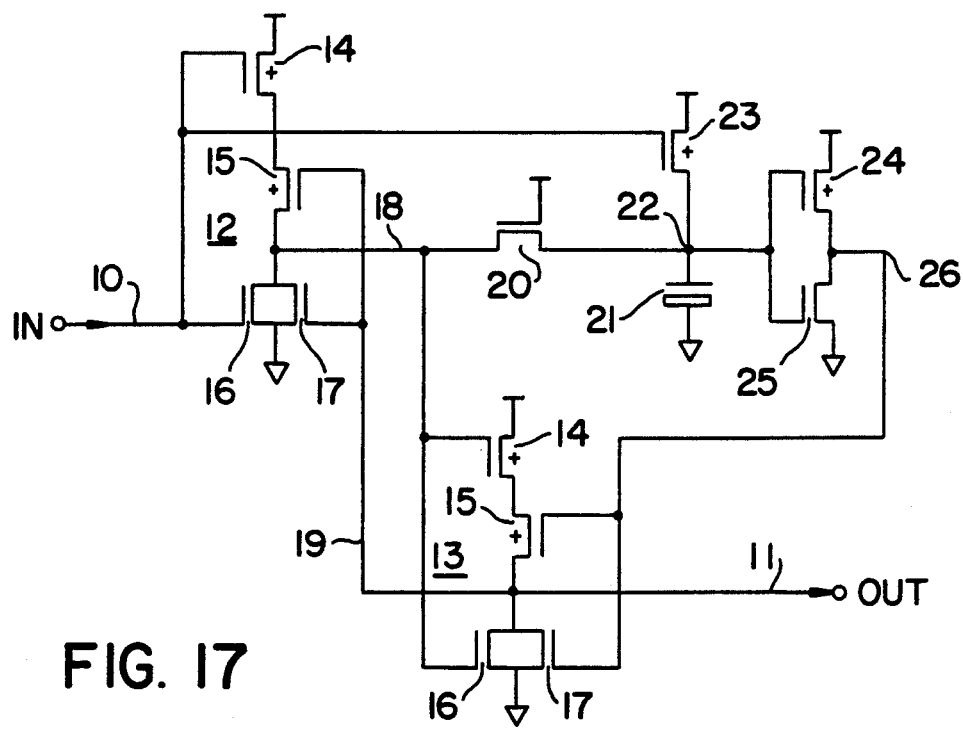
FIG. 17 illustrates a prior art delay circuit.
Figure 18:
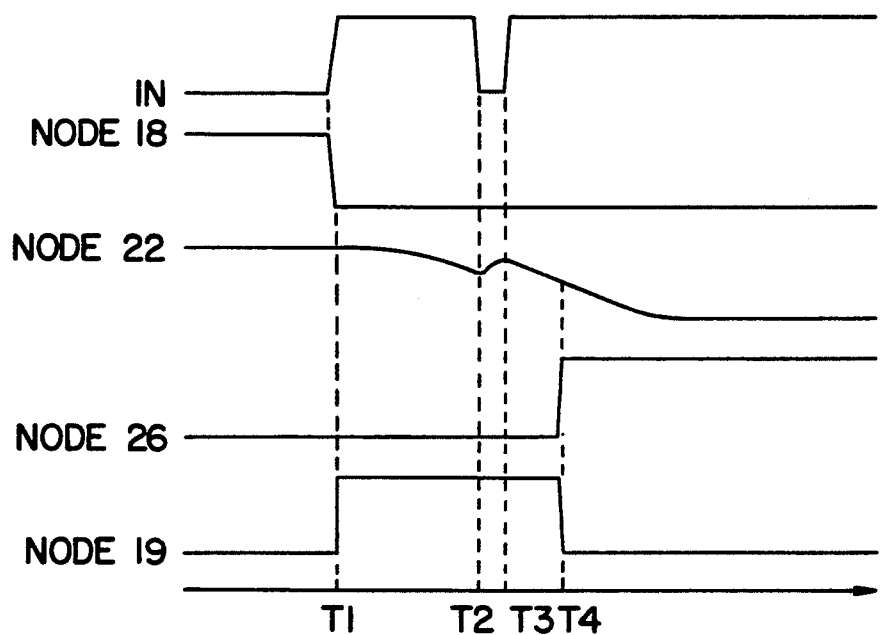
FIG. 18 illustrates the variations of voltages of some nodes in the prior art circuit of FIG. 17.
Figure 19:
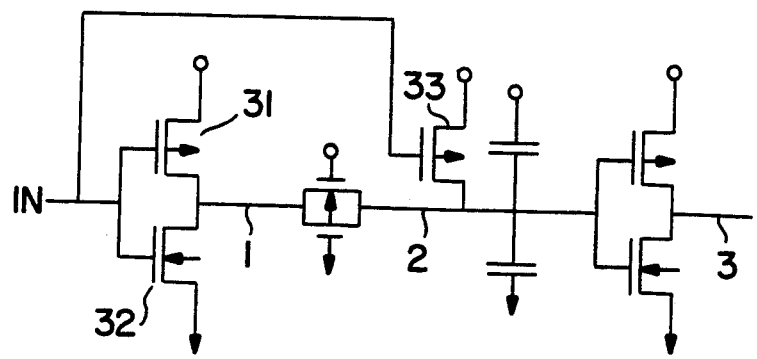
FIG. 19 shows a delay circuit as one embodiment of the present invention.
Figure 20:
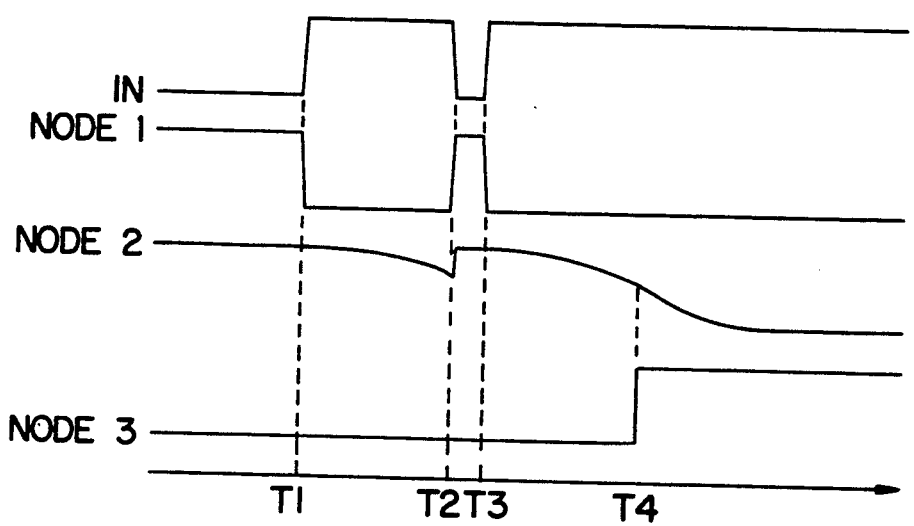
FIG. 20 shows the level charts for the nodes in the delay circuit of FIG. 19.

FIG. 14 is a view showing a delay circuit in accordance with another embodiment of the present invention. In this embodiment, the delay portion of the delay circuit of FIG. 4, comprising the transfer gate circuits and the charge-discharge capacitor circuits are replaced by CMOS inverters at many stages connected to each other. In FIG. 14, NAND 3 of a CMOS NAND gate and INV 3 of a CMOS inverter are equivalent to the output circuit 7 of FIG. 4. NAND3 receives a signal from NOR1 through NAND2 and NOR2. In general, to achieve an objective delaytime, arbitrary number of combinations of NAND2 and NOR2 can be disposed between NAND3 and NOR1.

When a signal CE*1 is changed from the 0 level to the 1 level, the level of node N404 is changed from the 0 level to the 1 level after a predetermined delay time so that an output CE** is also changed from the 0 level to the 1 level after a predetermined time.

When the signal CE*1 is changed from the 1 level to the 0 level, the levels of the nodes N401, N403 and N405, which are the outputs of NAND1, NAND2 and NAND3 respectively are rapidly reset to the 1 level, and the levels of the nodes N402 and N404 which are the outputs of NOR1 and NOR2 respectively are rapidly reset to the 0 level and the output of the delay circuit is rapidly changed from the 1 level to the 0 level. Even when the input signal CE*1 changes from the 0 level to the 1 level shortly after the generation of the noise P1 as shown in FIG. 3, nodes N401 and N403 are rapidly reset to the 1 level, and nodes N402 and N404 are rapidly reset to the 0 level in the short period between the noise P1 and the change of the input signal CE*1 from the 0 level to the 1 level, so that the output CE** changes from the 0 level to the 1 level after the change of the input signal CE*1 from the 0 level to the 1 level with a predetermined delay time. The delay circuit of FIG. 14 can be substituted for the delay circuit of FIG. 9.

As mentioned above, according to the present invention, when an input signal is changed in a predetermined direction, an output signal delayed by a predetermined time is generated. When the input signal is changed in a direction reverse to the predetermined direction, the potentials of the nodes of delay means are reset to the initial levels, and the output signal without delay is generated. Further, in a semiconductor circuit system having memory ICs, when a chip control signal is changed in a predetermined direction, the chip control signal is delayed by a predetermined time. And using the delayed chip control signal, an output portion of an data output buffer circuit is released from a high impedance state after a predetermined delay time. When the chip control signal is changed in a direction reverse to the predetermined direction, the output portion of the data output buffer circuit is controlled to rapidly become in the high impedance state. Accordingly the predetermined delay time can be reliably obtained even when noises are included in the chip control signal, and the circuit is stably operated without errors in operation.

We claim:

1. A semiconductor integrated circuit for transmitting a signal from an input terminal to an output terminal providing a predetermined stable delay for one level transition of said input signal and no delay for the other level transition of said input signal, comprising:

said input terminal for receiving said input signal and said output terminal for generating an output signal;

a first inverter having an input terminal connected to said input terminal of said integrated circuit and having an output terminal;

a second inverter having an input terminal connected to said output terminal of said first inverter means and having an output terminal;

a first NAND gate having a first input terminal connected to said output terminal of said second inverter, a second input terminal connected to said input terminal of said integrated circuit, and an output terminal;

a NOR gate having a first input terminal connected to said output terminal of said inverter, a second input terminal connected to said output terminal of said first NAND gate, and an output terminal; and a second NAND gate having a first input terminal connected to said input terminal of said integrated circuit, a second input terminal connected to said output terminal of said NOR gate, and an output terminal connected to said output terminal of said integrated circuit.

* * * * *